United States Patent [19]

Carpenter et al.

[11] 4,319,147

[45] Mar. 9, 1982

[54] MONITORING APPARATUS

[75] Inventors: James E. Carpenter, Orpington; Brian A. Goody, Carshalton, both of England

[73] Assignee: Fisher Controls International, Inc., Clayton, Mo.

[21] Appl. No.: 112,831

[22] Filed: Jan. 17, 1980

[30] Foreign Application Priority Data

Jan. 17, 1979 [GB] United Kingdom ............. 01696/79

[51] Int. Cl.³ ..................................... H03K 19/007
[52] U.S. Cl. ................................. 307/442; 307/247 R
[58] Field of Search .......... 307/200 A, 247 A, 247 R, 307/291, 309, 442; 328/5

[56] References Cited

U.S. PATENT DOCUMENTS

| | | | |
|---|---|---|---|
| 3,248,634 | 4/1966 | Fudaley et al. | 307/291 |
| 3,321,639 | 5/1967 | Fowler et al. | 307/291 X |
| 3,854,055 | 12/1974 | Sparks | 307/247 R |
| 3,886,381 | 5/1975 | Lohmann | 307/291 X |
| 4,122,359 | 10/1978 | Breikss | 307/200 A |

Primary Examiner—John S. Heyman
Attorney, Agent, or Firm—Arthur E. Hoffman

[57] ABSTRACT

Monitoring apparatus for producing an output in response to a predetermined condition comprising bistable means (4) having a set input, a reset input and an output; trigger means (2, 6) for applying a first train of pulses ($\phi_1$) to one of the inputs of the bistable means and for applying a second train of pulses of the same frequency as and different phase to the first train of pulses to the other input of the bistable means in response to a predetermined condition: and an output device (8) responsive to oscillation of the bistable means between its stable states.

8 Claims, 3 Drawing Figures

MONITORING APPARATUS

This invention relates to monitoring apparatus.

The invention relates particularly to monitoring apparatus of the kind adapted to provide a warning signal and/or effect a control action in response to the occurrence of a predetermined condition in an associated equipment. Such apparatus is commonly required to exhibit high integrity and to fail safely, e.g. when used as a safety apparatus to detect an undesirable condition in the associated equipment.

According to a first aspect of the invention a monitoring apparatus comprises bistable means having a set input, a reset input and an output; trigger means connected to said inputs of said bistable means for applying a first train of pulses to one of the said inputs of the bistable means and for applying a second train of pulses of the same frequency as and different phase to said first train of pulses to the other one of said inputs of the bistable means in response to a predetermined condition; and an output device responsive to oscillation of said bistable means between its stable states.

It will be appreciated that in such a monitoring apparatus the bistable means assumes a stable state in the absence of the predetermined condition and oscillates between its stable states, thereby producing a train of pulses at its output in response to the predetermined condition.

Preferably said trigger means comprises generator means which produces said first train of pulses and a third train of pulses of the same frequency and different phase; and logic means having a primary input to which said third train of pulses is applied, m secondary inputs and an output and being arranged to produce at its output, when input signals are applied to at least n of its secondary inputs, said second train of pulses having the same frequency and phase as said third train of pulses.

Preferably said first and second trains of pulses are substantially 180° out of phase.

Preferably said first and second trains of pulses have mark to space ratios not less than substantially 1 to 9.

Preferably said output device comprises a D.C. to D.C. converter.

According to a second aspect of the invention, a logic element suitable for use in a monitoring apparatus according to the first aspect of the invention has a primary input, a secondary input and an output, and comprises:

a transformer, across the primary winding of which is the primary input of the element; and semiconductor switch means arranged to be switched by a signal in the secondary winding of the transformer, the secondary input of the element being across said semiconductor switch means, and the output of the element being derived from the signal passing through said semiconductor switch means.

Preferably the logic means of the first aspect of the invention comprises $n \times C_n^m$ such logic elements connected in $C_n^m$ parallel lines each containing n elements in series.

There will now be described, by way of example only, one safety apparatus for monitoring four input voltages in according with a first aspect of the invention and including a logic means comprising logic elements according to a second aspect of the invention, with reference to the accompanying drawings, in which.

Figure 1:
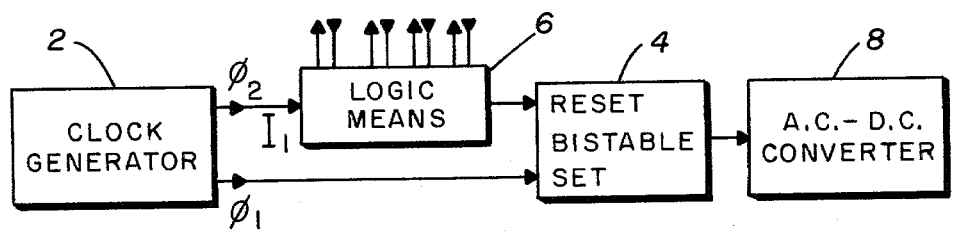
FIG. 1 shows a block diagram of the safety apparatus

Referring to FIG. 1, the safety apparatus includes a two-phase clock generator 2 which produces two trains of positive-going pulses $\phi_1$ and $\phi_2$. The two trains of pulses have the same frequency and are 180° out of phase. The pulses in each train have widths which are small compared to the repetition frequency: the mark to space ratio is typically 1 to 9 or greater.

The train of pulses $\phi_1$ is applied to the SET input of a bistable device 4. The train of pulses $\phi_2$ is applied to a primary input $I_1$ of a logic means 6, which will be described in greater detail below. Voltages to be monitored are applied to four secondary inputs $I_2$, $I_3$, $I_4$ and $I_5$ of the logic means 6. The output of the logic means is applied to the RESET input of the bistable 4. The output of the bistable 4 is applied to a transformer coupled D.C.-D.C. converter 8.

Figure 2:
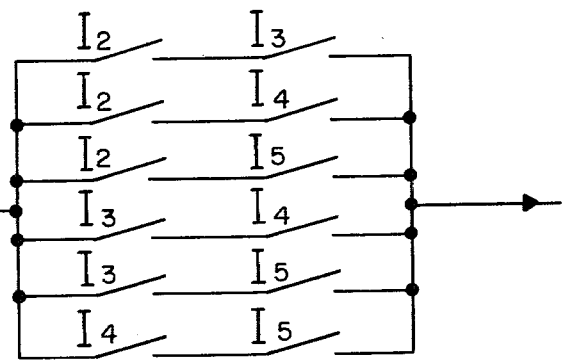
FIG. 2 shows a network logically equivalent to the logic means.

Referring now also to FIG. 2, the logic means 6 is arranged to produce at its output a train of pulses of the same frequency and phase as its input train of pulses $\phi_2$ when input voltages are applied to two or more of its secondary inputs $I_2$-$I_5$. FIG. 2 shows a logically equivalent network 10 having twelve switches connected two switches in series in six parallel lines. Each switch is labelled with one of the four secondary inputs $I_2$-$I_5$, to signify that the application of an input voltage to a particular secondary input is equivalent to closure of all the switches similarly labelled in the network 10.

It can be seen, therefore, that the closure of any two or more groups of switches labelled $I_2$, $I_3$, $I_4$ or $I_5$ (which is equivalent to the application of input voltages to the similarly labelled secondary inputs of the logic means 6) results in the estalishment of a signal path through the logic network 10 (which is equivalent to the production at the output of the logic means 6 of a train of pulses of the same frequency and phase as the train of pulses $\phi_2$).

Referring again to FIG. 1, it will be appreciated that when a logically equivalent signal path is provided through the logic means (i.e. when input voltages are applied to two or more of the four secondary inputs $I_2$-$I_5$ of the logic means 6), a train of pulses having the same frequency and phase as the train of pulses $\phi_2$ is applied to the RESET input of bistable 4, the train of pulses $\phi_1$ being directly applied to the SET input of the bistable. The bistable 4 is therefore continually set by the leading edge of a pulse in the train $\phi_1$ and is reset by the leading edge of a pulse in the train of pulses output from the logic means (having the same frequency and phase as the train of pulses $\phi_2$) after a time equal to half the period of the two trains of pulses $\phi/_1$ and $\phi_2$ (since the two trains of pulses are 180° out of phase). Hence in this case there is produced at the output of the bistable 4 a train of pulses of the same frequency as the trains of pulses $\phi_1$ and $\phi_2$, but having a unity mark to space ratio.

When no logically equivalent signal path is provided through the logic means (when less than two input voltages are applied to the four secondary inputs $I_2$-$I_5$ of the logic means 6) no signal is applied to the RESET input of the bistable 4. The bistable is therefore continually set by the leading edges of pulses in the train $\phi_1$, without ever being reset. Hence in this case the bistable 4 remains in one of its stable states.

The output of the bistable 4 drives the transformer coupled D.C.-D.C. converter 8, the output of which may be used to effect the operation of a safety device such as a lamp, relay, solenoid or motor (not shown). Hence power can only be supplied to the safety device if the output of the bistable is oscillating.

Figure 3:
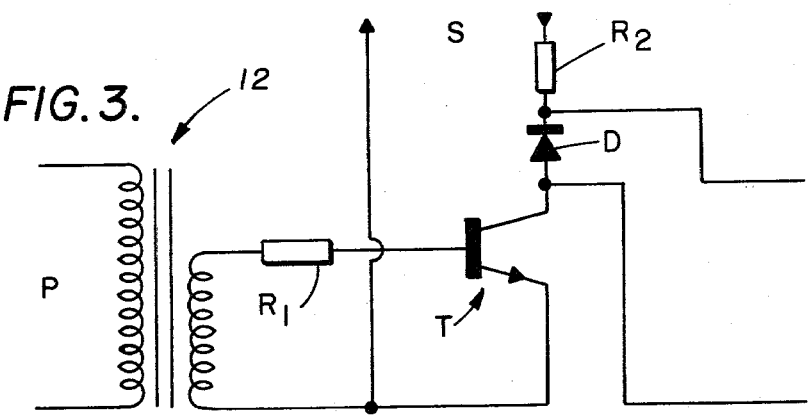
FIG. 3 shows the circuit diagram of an element of the logic means.

Referring now to FIG. 3, the logic means 6 comprises 12 (i.e. $2 \times C_2^4$ identical logic elements, of which one is shown in FIG. 3, connected two elements in series in six parallel lines, in the same way as the switches in the network of FIG. 2. Each element comprises a transformer 12, to one winding, P, of which an input train of pulses to the element is applied. The other winding of the transformer 12 is connected through a current limiting resistor $R_1$ across the base-emitter junction of a transistor T. A secondary input voltage to the element is applied at S through another current limiting resistor $R_2$ across the collector and emitter of the transistor T. The output train of pulses from the element is derived from the collector-emitter current of the transistor across a flyback protection diode D connected between the resistor $R_2$ and the collector of the transistor T.

Hence it will be appreciated that with an input voltage applied to the secondary input S of the element, a collector-emitter current will flow (and so an output from the element will be produced) only if a voltage greater than the threshold conduction voltage $V_{BE}$ is applied across the base-emitter junction of the transistor T. The element and the train of pulses $\phi_2$ are so arranged that the pulses so applied are of a voltage greater than $V_{BE}$. In this way, with a constant voltage applied to the secondary input S and the train of pulses $\phi_2$ applied to the primary input, the output of the element comprises a train of pulses of the same frequency and phase as the train of pulses $\phi_2$.

The element is arranged so that no inversion is introduced into the pulses. The transformer 12 is a step down device with a ratio such that a primary input pulse of amplitude equal to the maximum possible primary input supply voltage, if applied to a series chain of two such transformers, could not produce at the output of the second transformer a pulse equal to the transistor threshold conduction voltage $V_{BE}$.

The twelve such elements of the logic means 6 are connected in the same way as the switches in the network 10: two in series in six parallel lines, the secondary input applied to each stage being that with which the equivalent switch is labelled in FIG. 2.

It will be appreciated that with this arrangement of elements of the logic means 6, the secondary inputs $I_2-I_5$ are not isolated. If isolation between the secondary inputs is to be preserved, a further such element may be connected in series at the end of each line, the secondary input of each of these six further elements being connected to a constant power supply, which may be the same as that used to supply the clock generator 2.

We claim:

1. A monitoring apparatus comprising:
    bistable means having a set input, a reset input and an output;
    trigger means connected to said inputs of said bistable means for applying a first train of pulses to one of the said inputs of the bistable means and for applying a second train of pulses of the same frequency as and different phase to said first train of pulses to the other one of said inputs of the bistable means in response to a predetermined combination of constant input gating signals; and
    an output device responsive to oscillation of said bistable means between its stable states, said trigger means comprising:
    generator means which produces said first train of pulses and a third train of pulses of the same frequency and different phase; and
    logic means having a primary input to which said third train of pulses is applied, m secondary inputs and an output and being arranged to produce at its output, when said combination of constant input gating signals are applied to at least n of its secondary inputs, said second train of pulses having the same frequency and phase as said third train of pulses.

2. An apparatus according to claim 1 wherein said first and second trains of pulses are substantially 180° out of phase.

3. An apparatus according to claim 1 wherein said first and second trains of pulses have mark to space ratios not less than substantially 1 to 9.

4. An apparatus according to claim 1 wherein said output device comprises a D.C. to D.C. converter.

5. A monitoring apparatus comprising:
    bistable means having a set input, a reset input and an output;
    trigger means connected to said inputs of said bistable means for applying a first train of pulses to one of the said inputs of the bistable means and for applying a second train of pulses of the same frequency as and different phase to said first train of pulses to the other one of said inputs of the bistable means in response to a predetermined condition; and
    an output device responsive to oscillation of said bistable means between its stable states, said trigger means comprising:
    generator means which produces said first train of pulses and a third train of pulses of the same frequency and different phase; and
    logic means having a primary input to which said third train of pulses is applied, m secondary inputs and an output and being arranged to produce at its output, when input signals are applied to at least n of its secondary inputs, said second train of pulses, having the same frequency and phase as said third train of pulses, said logic means including $n \times C_n^m$ logic elements connected in $C_n^m$ parallel lines each containing n elements in series, each logic element having a primary input, a secondary input and an output, and comprising:
    a transformer, across the primary winding of which is the primary input of the element; and
    semiconductor switch means arranged to be switched by a signal in the secondary winding of the transformer.
    the secondary input of the element being across said semiconductor switch means, and the output of the element being derived from the signal passing through said semiconductor switch means.

6. An apparatus according to claim 5, wherein said first and second trains of pulses are substantially 180° out of phase.

7. An apparatus according to claim 5, wherein said first and second trains of pulses have mark to space ratios not less than substantially 1 to 9.

8. An apparatus according to claim 5, wherein said output device comprises a D.C. to D.C. converter.

* * * * *